United States Patent
Peterson et al.

(10) Patent No.: US 7,085,659 B2
(45) Date of Patent: Aug. 1, 2006

(54) DYNAMIC ENERGY THRESHOLD CALCULATION FOR HIGH IMPEDANCE FAULT DETECTION

(75) Inventors: John Peterson, Jeffersonville, PA (US); Ratan Das, Laflin, PA (US); Mohamed Y. Haj-Maharsi, Raleigh, NC (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 10/966,432

(22) Filed: Oct. 15, 2004

(65) Prior Publication Data

US 2006/0085146 A1    Apr. 20, 2006

(51) Int. Cl.
*G01R 31/00* (2006.01)

(52) U.S. Cl. .................................................... 702/58
(58) Field of Classification Search ................. 702/33, 702/35, 57, 58, 60, 189, 193; 324/522; 361/80; 700/293
See application file for complete search history.

(56) References Cited

U.S. PATENT DOCUMENTS

| 5,512,832 | A | * | 4/1996 | Russell et al. | 324/522 |
| 5,537,327 | A | * | 7/1996 | Snow et al. | 700/293 |
| 2005/0171647 | A1 | * | 8/2005 | Kunsman et al. | 700/293 |

* cited by examiner

*Primary Examiner*—Bryan Bui
(74) *Attorney, Agent, or Firm*—Michael M. Rickin

(57) ABSTRACT

A technique for dynamically determining the occurrence of a high impedance fault (HIF) independent of load. An HIF algorithm provides the energy value for a given number of samples of the input signal that is phase (load) currents and/or neutral (residual) current. The input signal energy value is multiplied by a factor that ranges from about 110% to about 300% to calculate a threshold energy value and the result of that calculation is stored in a buffer. A HIF detection signal is generated when the energy value determined for samples of the input signal that are the same in number as the given number of samples and taken after the given number of samples is greater than an energy value derived from a predetermined number of the calculated threshold energy values.

22 Claims, 1 Drawing Sheet

Implementation diagram of the Dynamic threshold algorithm

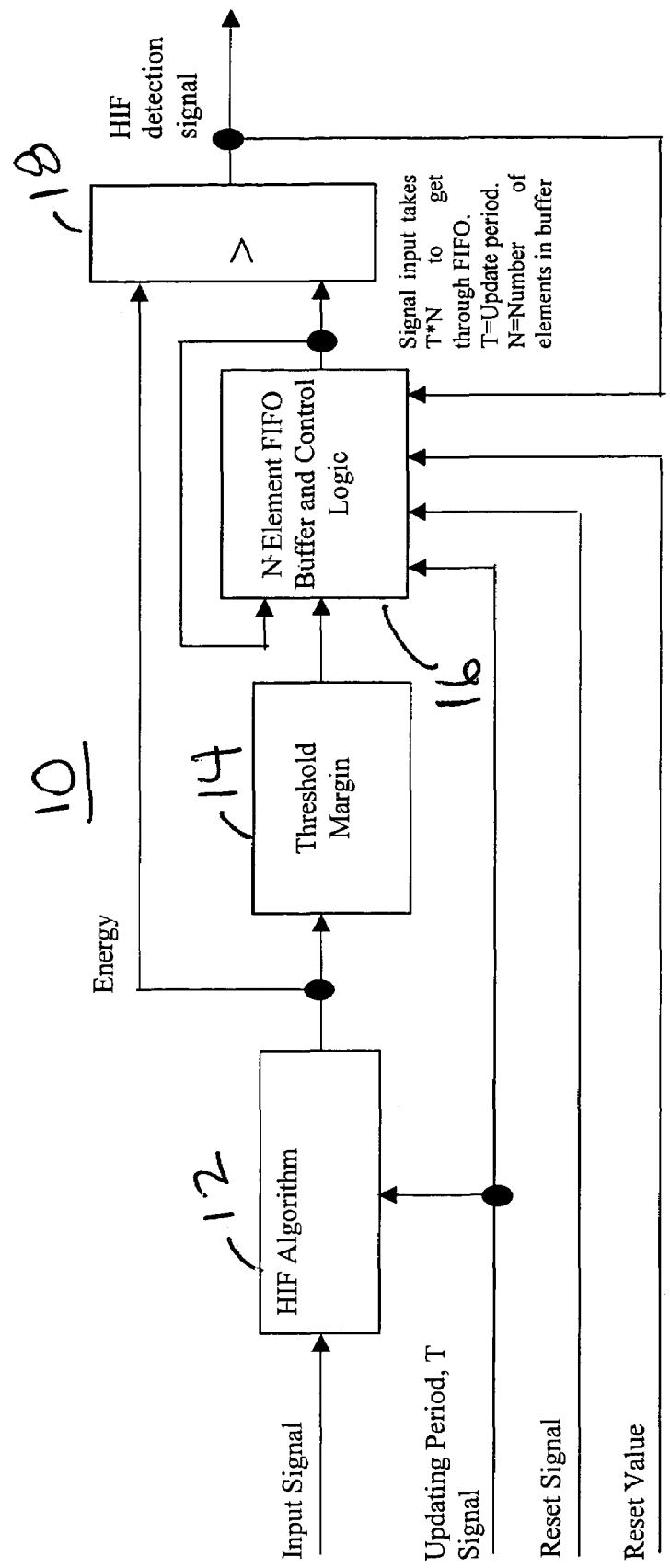
Figure 1: Implementation diagram of the Dynamic threshold algorithm

US 7,085,659 B2

DYNAMIC ENERGY THRESHOLD CALCULATION FOR HIGH IMPEDANCE FAULT DETECTION

BACKGROUND OF THE INVENTION

The present invention is directed toward high impedance fault (HIF) detection and, more particularly, toward a technique to make the detection independent of load.

BACKGROUND

Electric utility companies use overhead energized conductors to transport electrical energy to consumers. There are over one million miles of overhead distribution lines in the United States, supplying energy for industrial, commercial, and residential customers. The overhead conductors are exposed to the elements and to abnormal conditions. In some cases, the conductors fall to the ground and, depending on the surface, establish a conducting path. If the surface is grass, soil, or asphalt, a HIF occurs, in which case the fault current is much smaller than that of a typical phase-to-ground fault. This smaller fault current makes detection of an HIF difficult with conventional protection devices.

The danger with downed conductors is the risk of public contact with the energized lines. Human contact with downed conductors can result in serious injury or even death. The problem is further complicated once a downed conductor is detected. If a relay trips a circuit breaker at a substation, the loss of power to vital public entities, such as hospitals, airports, and traffic signals, can result in life-threatening situations of equal or greater magnitude. Thus, the problems facing protection engineers are to first detect the type of disturbances and then to react appropriately.

U.S. patent application Ser. No. 10/770,270 filed on Feb. 2, 2004 and entitled "High Impedance Fault Detection" ("the '270 application"), the disclosure of which is hereby incorporated herein by reference, describes the implementation in a relay platform of three detection algorithms that each use various features of phase and/or ground currents to individually detect a HIF. The HIF detection algorithms described in the '270 application are wavelet based, higher order statistics based and neural network based.

U.S. provisional Patent Application No. 60/553,504 filed on Mar. 16, 2004, now U.S. patent application Ser. No. 11/081,042, and entitled "Digital Signal Processor Implementation Of High Impedance Fault Algorithms", the disclosure of which is hereby incorporated herein by reference, describes the implementation of the three algorithms described in the '270 application on a relay platform with a digital signal processor.

Each of the HIF algorithms calculate the energy content of an input signal from an electrical power line, such as the phase (load) currents and/or neutral (residual) current on the power line, for selected frequency components and compare that calculation to a given threshold. The rate of detection can, therefore, be impaired when the value given to the threshold is fixed since when the steady-state energy level of the phase (load) currents and/or neutral (residual) current for the selected frequency band is high, the false detection rate increases and when it becomes low the false detection rate decreases. Considering that the steady-state energy level of the input signal depends on the load, it is not practical to set a static threshold that fits all conditions and provides good HIF detection performance.

Therefore it is desirable to ensure good HIF detection performance by making the threshold calculation in each of the algorithms independent of the load. The present invention uses a dynamic energy threshold calculation to address these concerns and cancel the impact of load on HIF detection.

SUMMARY OF THE INVENTION

A method for dynamically determining the occurrence of a high impedance fault (HIF) on an electrical power line comprising:
  using a predetermined technique to determine an energy value for a given number of samples of an input signal taken from said electrical power line;
  calculating a threshold energy value for each said determined energy value by multiplying each said determined energy value by a predetermined factor;
  deriving from a predetermined number of said calculated threshold energy values an energy value;
  taking, after said given number of samples of said input signal have been taken from said power line, further samples of said input signal that are equal in number to said given number of samples and determining from said further number of samples an energy value; and
  providing a HIF detection signal when said energy value determined from said further number of samples is greater than said energy value derived from said predetermined number of said calculated threshold energy values.

A method for dynamically determining the occurrence of a high impedance fault (HIF) on an electrical power line signal comprising:
  using a predetermined technique to determine an energy value for a given number of samples of an input signal taken from said electrical power line;
  calculating a threshold energy value for each said determined energy value by multiplying each said determined energy value by a predetermined factor;
  deriving from a predetermined number of said calculated threshold energy values an energy value;

taking, after said given number of samples of said input signal have been taken from said power line, further samples of said input signal that are equal in number to said given number of samples and determining from said further number of samples an energy value;
  comparing said energy values derived from said predetermined number of said calculated threshold energy values with said energy value determined from said further number of samples; and
  indicating the occurrence of a HIF when said energy value determined from said further number of samples is greater than said derived energy value.

A system for dynamically determining the occurrence of a high impedance fault (HIF) on an electrical power line comprising:
  means for determining an energy value for a given number of samples of an input signal taken from said electrical power line;
  means for calculating a threshold energy value for each said determined energy value by multiplying each said determined energy value by a predetermined factor; and
  means for taking, after said given number of samples of said input signal have been taken from said power line, further samples of said input signal that are equal in number to said given number of samples and determining from said further number of samples an energy value; and means for providing a HIF detection signal when said energy value determined from said further number of samples is greater than said energy value derived from a predetermined number of said calculated threshold energy values.

BRIEF DESCRIPTION OF THE DRAWINGS

The features, aspects, and advantages of the present invention will become better understood with regard to the following description, appended claims, and accompanying drawings where:

FIG. 1, the only drawing figure, is a block diagram for the dynamic energy threshold HIF detection technique of the present invention.

DETAILED DESCRIPTION OF THE PREFERRED EMBODIMENTS

Referring now to FIG. 1, which is the only drawing figure, there is shown a block diagram for the dynamic energy threshold HIP detection technique 10 of the present invention. The input signal comprising of phase (load) currents and/or neutral (residual) current, is input to the HIF detection algorithm 12 for processing. The HIF detection algorithm 12 may be one of the three algorithms described in the '270 application. The output of the HIF algorithm 12 is the energy of the input signal. This input signal energy is then multiplied by a factor, called Threshold Margin 14, that can be set to a value in the range from about 110% to about 300% depending on the security of detection required. The result of that multiplication, known as Threshold Energy, is stored into a First-In First-Out (FIFO) buffer and control logic 16. Trials with captured field data indicate that there may be an unacceptable number of false detections when using a Threshold Margin lower than 125%. In general, the user of technique 10 would increase the Threshold Margin if the protected line has normally large and quickly varying frequency components of interest and the user wanted to reduce the probability of false detection.

The FIFO buffer 16 has N elements and each element is updated every T seconds. The total delay from the input to the output of the buffer 16 is T*N seconds. The values used for T and N in one embodiment of the present invention are T=10 seconds and N=8 for a total delay through buffer 16 of 80 seconds or one (1) minute and 20 seconds. The updating period, T, is in that one embodiment selected as 10 seconds because it is the shortest time that produced acceptable detections given the sampling rate of 32 samples per cycle (about 2 kHz) in that embodiment. The value of 8 for N in that one embodiment is chosen to give the desired separation in number of minutes, one (1) in that embodiment, of lead-time between the present calculated energy and the Threshold Energy value: N=(number of minutes*6)+2 [where six (6) is the number of 10 second intervals in one (1) minute]. This value for N provides a clear distinction between pre-fault and fault values.

The number of minutes or unit of time should be the maximum amount of time that it is expected to detect the fault. After that time expires, the fault energy begins to appear in the Threshold Energy which then makes detection less and less likely. The number of minutes or unit of time should be short enough that the HIF algorithm 12 can track normal changes in the load.

Any element of the FIFO buffer 16 can be used as the threshold energy and is compared at 18 to the present energy signal. In one embodiment of the present invention the three oldest values of the FIFO buffer 16, that is the three oldest values of the Threshold Energy, are used in a filter (not shown) to produce the one threshold value. There is a tradeoff between keeping enough older values to provide sufficient time for detection versus keeping even more older values and not using them which wastes memory. The filter provides for a smoother transition of the threshold outputs and because the data is updated so slowly (once every 10 seconds), any type of low-pass filter should be adequate to perform that function. When the input signal energy has a value greater than the Threshold Energy, an HIF detection signal is generated and that signal can be used to raise an HIF detection flag by any means, not shown but well known to those of ordinary skill in the art.

It should be appreciated that while the embodiment described above uses the three oldest values of Threshold Energy stored in buffer 16 as the input to the filter to produce the one threshold value used for comparison, any or all of the values in the buffer 16 can be used for that purpose. In that one embodiment it was decided to use a filter that was easy to implement and that filter happens to use only the three oldest values.

During a reset of the algorithm, as would occur during initialization, all elements in the FIFO buffer 16 are assigned a reset value. The reset value is a relatively large value that prevents the comparator 18 from being activated and thus prevents a false detection while the system adapts to the input signal it is monitoring. Since the largest Threshold Margin is 300% or three times the typical load value a suitable reset value might be 10 times the typical load value that is obtained from the field data.

During normal operation, a HIF detection signal is generated when the computed input signal energy is larger than the Threshold Energy. This detection signal causes all elements of the FIFO buffer 16 to be set to the present output Threshold Energy threshold value. This provides a type of seal-in for the detection since an algorithm that has picked up, that is detected a HIF, will not drop out because the next Threshold Energy in the FIFO buffer 16 is larger. This action also clears the threshold pipeline of any values that may have been influenced by the fault before the Threshold Energy was exceeded.

While the invention has been shown and described with respect to particular embodiments thereof, those embodiments are for the purpose of illustration rather than limitation, and other variations and modifications of the specific embodiments herein described will be apparent to those skilled in the art, all within the intended spirit and scope of the invention. Accordingly, the invention is not to be limited in scope and effect to the specific embodiments herein described, nor in any other way that is inconsistent with the extent to which the progress in the art has been advanced by the invention.

What is claimed is:

1. A method for dynamically determining the occurrence of a high impedance fault (HIF) on an electrical power line comprising:

using a predetermined technique to determine an energy value for a given number of samples of an input signal taken from said electrical power line;

calculating a threshold energy value for each said determined energy value by multiplying each said determined energy value by a predetermined factor;

deriving from a predetermined number of said calculated threshold energy values an energy value;

taking, after said given number of samples of said input signal have been taken from said power line, further samples of said input signal that are equal in number to said given number of samples and determining from said further number of samples an energy value; and providing a HIF detection signal when said energy value determined from said further number of samples is greater than said energy value derived from said predetermined number of said calculated threshold energy values.

2. The method of claim 1 wherein said predetermined factor ranges from about 110% to about 300%.

3. The method of claim 1 wherein said predetermined number of the calculated threshold energy values are the oldest of such values.

4. The method of claim 3 wherein said predetermined number of said calculated threshold energy values is three.

5. The method of claim 1 further comprising storing each of said threshold energy values and deriving said energy value from a predetermined number of said stored threshold energy values.

6. The method of claim 1 further comprising comparing said energy value determined for samples of said input signal taken after said given number of samples with said energy value derived from a predetermined number of the calculated threshold energy values.

7. The method of claim 1 further comprising raising an HIF detection flag from said HIF detection signal.

8. The method of claim 1 further comprising setting in response to said HIF detection signal all of said calculated threshold energy values to said energy value determined for samples of said input signal taken after said given number of samples.

9. The method of claim 5 further comprising setting in response to said HIF detection signal all of said stored threshold energy values to said energy value determined for samples of said input signal taken after said given number of samples.

10. The method of claim 1 wherein said input signal is the phase (load) currents and/or neutral (residual) current.

11. A method for dynamically determining the occurrence of a high impedance fault (HIF) on an electrical power line signal comprising:

using a predetermined technique to determine an energy value for a given number of samples of an input signal taken from said electrical power line;

calculating a threshold energy value for each said determined energy value by multiplying each said determined energy value by a predetermined factor;

deriving from a predetermined number of said calculated threshold energy values an energy value;

taking, after said given number of samples of said input signal have been taken from said power line, further samples of said input signal that are equal in number to said given number of samples and determining from said further number of samples an energy value;

comparing said energy values derived from said predetermined number of said calculated threshold energy values with said energy value determined from said further number of samples; and indicating the occurrence of a HIF when said energy value determined from said further number of samples is greater than said derived energy value.

12. The method of claim 11 wherein said predetermined factor ranges from about 110% to about 300%.

13. The method of claim 11 wherein said calculated threshold energy values used in said comparison is the oldest of such calculated values.

14. The method of claim 13 wherein said predetermined number of said oldest calculated values is three.

15. The method of claim 11 further comprising storing each of said threshold energy values and deriving said energy value from a predetermined number of said stored threshold energy values.

16. The method of claim 11 wherein said input signal is the phase (load) currents and/or neutral (residual) current.

17. A system for dynamically determining the occurrence of a high impedance fault (HIF) on an electrical power line comprising:

means for determining an energy value for a given number of samples of an input signal taken from said electrical power line;

means for calculating a threshold energy value for each said determined energy value by multiplying each said determined energy value by a predetermined factor;

means for taking, after said given number of samples of said input signal have been taken from said power line, further samples of said input signal that are equal in number to said given number of samples and determining from said further number of samples an energy value; and means for providing a HIF detection signal when said energy value determined from said further number of samples is greater than said energy value derived from a predetermined number of said calculated threshold energy values.

18. The system of claim 17 further comprising means for storing each of said threshold energy values and deriving said energy value from a predetermined number of said stored threshold energy values.

19. The system of claim 18 wherein said storing means is a First-In First-Out (FIFO) buffer.

20. The system of claim 18 wherein all of said calculated threshold energy values are in response to said HIF detection signal set to said energy value determined for samples of said input signal taken after said given number samples.

21. The system of claim 17 further comprising means for comparing said energy value determined for samples of said input signal taken after said given number of samples with said energy value derived from a predetermined number of the calculated threshold energy values.

22. The system of claim 17 wherein said input signal is the phase (load) currents and/or neutral (residual) current.

* * * * *